United States Patent
Fuehrer

(10) Patent No.: US 12,028,961 B2
(45) Date of Patent: Jul. 2, 2024

(54) ELECTRICAL ASSEMBLY WITH A TEMPERATURE MONITORING DEVICE

(71) Applicant: PHOENIX CONTACT E-Mobility GmbH, Schieder-Schwalenberg (DE)

(72) Inventor: Thomas Fuehrer, Blomberg (DE)

(73) Assignee: PHOENIX CONTACT E-MOBILITY GMBH, Schieder-Schwalenberg (DE)

( * ) Notice: Subject to any disclaimer, the term of this patent is extended or adjusted under 35 U.S.C. 154(b) by 367 days.

(21) Appl. No.: 17/625,338

(22) PCT Filed: Jun. 22, 2020

(86) PCT No.: PCT/EP2020/067280
§ 371 (c)(1),
(2) Date: Jan. 7, 2022

(87) PCT Pub. No.: WO2021/004765
PCT Pub. Date: Jan. 14, 2021

(65) Prior Publication Data
US 2022/0264737 A1    Aug. 18, 2022

(30) Foreign Application Priority Data
Jul. 11, 2019 (LU) ....................... 101309

(51) Int. Cl.
*H05K 1/02*        (2006.01)
*B60L 53/16*     (2019.01)
(Continued)

(52) U.S. Cl.
CPC ............ *H05K 1/0201* (2013.01); *B60L 53/16* (2019.02); *B60L 53/18* (2019.02); *B60L 53/62* (2019.02);
(Continued)

(58) Field of Classification Search
CPC ................ H05K 1/0201; H05K 1/181; H05K 2201/10151; H05K 2201/10295;
(Continued)

(56) References Cited

U.S. PATENT DOCUMENTS 6,210,036 B1    4/2001 Eberle et al.
8,325,454 B2   12/2012 Brugner et al.
(Continued)

FOREIGN PATENT DOCUMENTS

DE    102014111334 A1    2/2016
DE    102015106251 A1   10/2016
(Continued)

*Primary Examiner* — Travis S Chambers
(74) *Attorney, Agent, or Firm* — LEYDIG, VOIT & MAYER, LTD.

(57) ABSTRACT

An electrical assembly includes a support element which has a body and a surface formed on the body, an electrical functional element arranged on the support element, and a temperature monitoring device arranged on the support element for monitoring a temperature on the electrical functional element. The temperature monitoring device includes a temperature sensor arranged on the surface of the support element, a physical contact element arranged on the surface of the support element, and at least one heat-conducting device embedded in the body of the support element. The at least one heat-conducting device extends at least in sections below the temperature sensor in the body and is thermally connected to the physical contact element via at least one through-connection. The physical contact element is thermally coupled to a coupling surface operatively connected to the electrical functional element.

15 Claims, 7 Drawing Sheets

(51) Int. Cl.
   *B60L 53/18* (2019.01)
   *B60L 53/62* (2019.01)
   *H01R 13/66* (2006.01)
   *H05K 1/18* (2006.01)
   *H01R 27/02* (2006.01)

(52) U.S. Cl.
   CPC ......... *H01R 13/6683* (2013.01); *H05K 1/181* (2013.01); *H01R 27/02* (2013.01); *H01R 2201/26* (2013.01); *H05K 2201/10151* (2013.01); *H05K 2201/10295* (2013.01); *H05K 2201/10333* (2013.01); *H05K 2201/10522* (2013.01); *H05K 2201/10606* (2013.01)

(58) Field of Classification Search
   CPC ......... H05K 2201/10333; H05K 2201/10522; H05K 2201/10606; B60L 53/16; B60L 53/18; B60L 53/62; B60L 53/30; H01R 13/6683; H01R 27/02; H01R 2201/26; Y02T 10/70
   See application file for complete search history.

(56) References Cited

U.S. PATENT DOCUMENTS

| | | |
|---|---|---|
| 2016/0039297 A1 | 2/2016 | Kretschmer et al. |
| 2018/0097316 A1 | 4/2018 | Rose et al. |
| 2020/0381874 A1 | 12/2020 | Rose et al. |
| 2023/0107112 A1* | 4/2023 | Hille ............... H01R 13/20 324/538 |

FOREIGN PATENT DOCUMENTS

| | | |
|---|---|---|
| DE | 202017105818 U1 | 11/2017 |
| DE | 102018120057 A1 | 2/2019 |
| EP | 2605339 A1 | 6/2013 |
| GB | 2489988 A | 10/2012 |
| WO | WO 2016169940 A1 | 10/2016 |
| WO | WO 2018197247 A1 | 11/2018 |

* cited by examiner

ELECTRICAL ASSEMBLY WITH A TEMPERATURE MONITORING DEVICE

CROSS-REFERENCE TO PRIOR APPLICATIONS

This application is a U.S. National Phase application under 35 U.S.C. § 371 of International Application No. PCT/EP2020/067280, filed on Jun. 22, 2020, and claims benefit to Luxembourg Patent Application No. LU 101309, filed on Jul. 11, 2019. The International Application was published in German on Jan. 14, 2021 as WO 2021/004765 under PCT Article 21(2).

FIELD

The invention relates to an electrical assembly and a connector part for plug-in connection with a mating connector part.

BACKGROUND

Such an electrical assembly comprises a support element having a body and a surface formed on the body. The electrical assembly also comprises an electrical functional element arranged on the support element and a temperature monitoring device arranged on the support element for monitoring a temperature on the electrical functional element.

Such an electrical assembly can be, for example, a component of a connector part, which can be, for example, a plug or a socket. Such a connector part can be used in particular on a charging device for transmitting a charging current. The connector part can in particular be designed as a charging plug or charging socket for charging a motor vehicle powered by an electric motor (also referred to as an electric vehicle) and can be used on the side of a charging station, e.g., as a charging plug on a charging cable, or on the side of a vehicle as a so-called inlet.

Charging plugs or charging sockets for charging electric vehicles are to be designed such that large charging currents can be transmitted. Since thermal power dissipation increases quadratically with the charging current and it is also prescribed that a temperature increase at a connector part must not exceed 50 kelvin (K), it is necessary with such charging plugs or charging sockets to provide temperature monitoring in order to detect overheating at components of the charging plug or charging socket at an early stage and, if necessary, to modify the charging current or even switch off the charging device.

In a charging plug known from EP 2 605 339 A1, a temperature sensor is arranged on an insulating body approximately in the center between contact elements of the contact plug. Via the temperature sensor, it can be detected whether there is any excessive heating somewhere on the contact elements, in order to cause the charging process to be switched off, if necessary.

In a charging plug known from GB 2 489 988 A, several temperature sensors are provided which transmit temperature data via a line. A charging process is regulated depending on the temperature range in which the temperatures recorded at the temperature sensors are located.

From U.S. Pat. No. 6,210,036 B1, a connector is known in which several temperature sensors are linked in series with one another via a single-core line. The temperature sensors are arranged on an insulating body and, at a predetermined temperature, exhibit a significant change in resistance that is so high that a control circuit connected to the line can detect the change and adjust and, if necessary, switch off the current flow through the charging plug.

U.S. Pat. No. 8,325,454 B2 discloses a plug in which thermistors are associated with individual contacts, are connected in parallel to one another, and switch on a thyristor when a threshold temperature is exceeded, in order to in this way switch off a current flow through the contacts.

In charging plugs known from the prior art, temperature sensors are embedded in an insulating body, for example. This is necessary in order to electrically insulate the temperature sensors from the contact elements at which heating can occur. At the same time, this has the disadvantage that a temperature change at one of the contact elements is transmitted via the insulating body with a time delay and is thus perceived at the temperature sensors with a time delay. In particular with concepts which are supposed to enable a fast switch-off of a load circuit in the event of a fault, such arrangements of temperature sensors are therefore unsuitable in some circumstances.

SUMMARY

In an embodiment, the present invention provides an electrical assembly comprising a support element which has a body and a surface formed on the body, an electrical functional element arranged on the support element, and a temperature monitoring device arranged on the support element for monitoring a temperature on the electrical functional element, wherein the temperature monitoring device comprises a temperature sensor arranged on the surface of the support element, a physical contact element arranged on the surface of the support element, and at least one heat-conducting device embedded in the body of the support element, wherein the at least one heat-conducting device extends at least in sections below the temperature sensor in the body and is thermally connected to the physical contact element via at least one through-connection, and wherein the physical contact element is thermally coupled to a coupling surface operatively connected to the electrical functional element.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
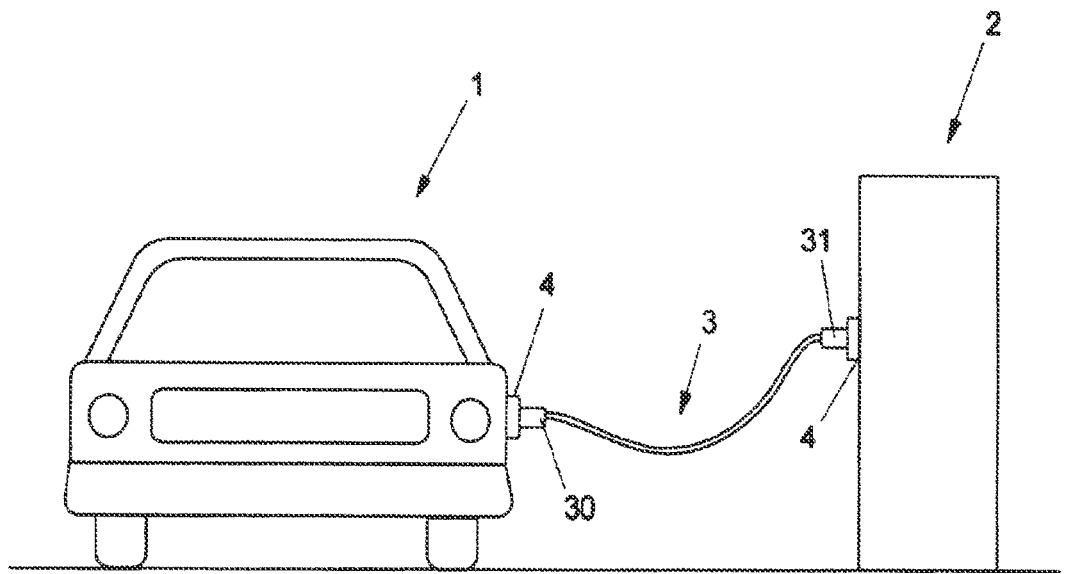
FIG. 1 shows a schematic representation of an electric vehicle with a charging cable and a charging station for charging.

There is a need for a temperature monitoring device which can be simple and cost-effective in design and allows temperature monitoring on the contact elements with a fast response behavior for rapid initiation of countermeasures, such as a fast switch-off of a charging current.

In a connector part known from DE 10 2015 106 251 A1, contact elements are arranged in openings in a circuit board. One or more sensor devices are provided on the circuit board and serve to detect heating at one or more contact elements.

In a connector part of a charging system known from WO 2016/169940 A1 for charging an electric vehicle, an electrical functional element in the form of a contact element is arranged on a support element in the form of a circuit board. For thermal coupling to a temperature sensor, a coupling section, which establishes a thermal coupling between the contact element and the temperature sensor arranged spatially at a distance from the contact element, is embedded in a body of the circuit board.

A temperature sensor can usually be arranged, for example, as a surface-mounted, so-called SMD component (SMD: "surface-mounted device") on a support element in the form of a circuit board. Such an SMD component has no wire connections and is soldered to contact points on the surface of the support element. In such a temperature sensor designed as an SMD component, care must be taken to ensure that the temperature sensor does not undergo excessive mechanical loads during operation, in order to avoid impairing soldered connections connecting the temperature sensor to the support element. However, this can complicate thermal coupling to an electrical functional element that is to be monitored.

In addition, a temperature sensor designed as an SMD component usually has a compact design and thus a comparatively low heat capacity. This can lead to a situation in which heating absorbed by an electrical functional element is conducted away from the temperature sensor directly into the support element, which can slow down the response behavior of the temperature sensor.

In some embodiments, the present invention provides a connector part which enables temperature monitoring, with fast response behavior and a simple design, of an electrical functional element, in particular an electrical contact element, in a simple and cost-effective manner.

Accordingly, the temperature monitoring device according to the invention has a temperature sensor arranged on the surface of the support element, a physical contact element arranged on the surface of the support element, and at least one heat-conducting device embedded in the body of the support element. The at least one heat-conducting device extends at least in sections below the temperature sensor in the body and is thermally connected to the physical contact element via at least one through-connection. The physical contact element is thermally coupled to a coupling surface that is operatively connected to the electrical functional element.

The heat-conducting device can, for example, extend planarly along a plane of the support element, which is formed, for example, by a circuit board, wherein several heat-conducting devices can be arranged in parallel to one another in different planes of the support element. The heat-conducting device can, for example, have a disk shape, for example, a circular disk shape. Alternatively, the heat-conducting device can be formed, for example, by a structure of heat-conducting tracks, for example in the form of a grid.

In the case of the electrical assembly, a thermal coupling between the electrical functional element, for example an electrical contact element of a connector part, and the temperature monitoring device is established via a physical contact element which, when the electrical assembly is mounted, is in a thermally coupling contact with an associated coupling surface of the electrical functional element. The physical contact element is preferably in direct spatial proximity to the temperature sensor of the temperature monitoring device and extends, for example, in one embodiment, in a circular arc around the temperature sensor. Thermal energy from the electrical functional element can be introduced via the physical contact element into the temperature monitoring device in order to monitor heating at the electrical functional element by means of the temperature sensor.

The physical contact element is thermally connected to one or more heat-conducting devices embedded in the body of the support element. The thermal connection is in this case established via one or more through-connections so that heat can be conducted from the physical contact element via the one or more through-connections to the heat-conducting device or devices embedded in the body of the support element.

The at least one heat-conducting device is preferably embedded below the physical contact element in the body of the support element. Via one or more through-connections, a connection is established between the physical contact element and the heat-conducting device or devices arranged underneath it so that heat can be introduced from the physical contact element into the heat-conducting devices.

The at least one heat-conducting device extends at least in sections below the temperature sensor in the body of the support element. The temperature sensor is thus also heated from below via the heat-conducting device so that heat introduced into the temperature sensor from the side of the functional element can flow off directly into the support element. The response behavior of the temperature monitoring device can be improved in this way so that a temperature increase at the electrical functional element can be detected with a slight time delay via the temperature sensor.

The physical contact element and/or the at least one heat-conducting device can be produced, for example, from a metallic, highly thermally conductive material. Alternatively, the physical contact element and/or the at least one heat-conducting device can also be produced from a thermally conductive plastic material or a ceramic material.

The support element is realized, for example, in the form of a circuit board. In this case, the body of the circuit board consists of an electrically non-conductive material onto which conductor tracks are applied and/or into which conductor tracks are introduced, for example, in different planes.

In one embodiment, the at least one through-connection extends from the physical contact element on the surface of the support element at least partially through the body of the support element. Heat-conducting devices located below the physical contact element are thus contacted with the physical contact element via the at least one through-connection and are thus thermally coupled to the physical contact element.

As usually understood by the technical specialist, the at least one through-connection is an electrical connection which extends substantially vertically through the support element and via which, in the case of a support element designed as a circuit board, planes of the circuit board that are at an offset from one another can be connected to one another. The through-connection can have a hole metallized on its inner lateral surface, wherein each through-connection is preferably filled with a thermally conductive filling compound, in particular a soldering material. The at least one through-connection can be filled, for example, using a reflow soldering process, as part of which the soldering compound is introduced into each through-connection of the temperature monitoring device.

In one embodiment, the at least one heat-conducting device is thermally connected to the physical contact element via several through-connections which are arranged next to one another along a circumferential direction extending around the temperature sensor. The through-connections can, for example, be arranged next to one another along a circular arc or a closed circle and thus establish a coupling between the at least one heat-conducting device and the physical contact element at locations spaced apart from one another. In this way, heat can be introduced from the physical contact element into the at least one heat-conducting device in a uniform manner so that the at least one heat-conducting device is heated uniformly below the temperature sensor.

In one embodiment, the physical contact element extends around the temperature sensor at least in sections on the surface of the support element. The physical contact element can, for example, take the form of a ring that is circumferentially closed or is circumferentially open at one or more locations. However, the physical contact element can, for example, also have an angular shape, for example a quadrangular shape.

In one embodiment, the physical contact element has a notch at which the physical contact element is interrupted when viewed along a circumferential direction extending around the temperature sensor. Feed lines which are connected to the temperature sensor can, for example, extend through such a notch. The feed lines extend along the surface of the support element and are connected to the temperature sensor but do not contact the physical contact element but rather are led out of the physical contact element through the notch.

The feed lines are preferably not in contact with the coupling surface. In the case of several feed lines, no short circuit is thus created between neighboring feed lines via the coupling surface. In particular, a recess in which the feed lines lie can be formed on the coupling surface for this purpose so that touching of the coupling surface and the feed lines is prevented.

In one embodiment, the temperature monitoring device has several heat-conducting devices embedded in the body of the support element and extending in parallel to one another. A plurality of heat-conducting devices is thus introduced into the body of the support element in different planes, wherein the heat-conducting devices can, for example, each have a disk shape, for example in the form of a circular disk, or can also be differently shaped. The heat-conducting devices are each thermally coupled to the physical contact element via one or more through-connections so that heat can be introduced into all heat-conducting devices via one or more through-connections.

In one embodiment, a receiving chamber in which the temperature sensor of the temperature monitoring device is accommodated is formed on the coupling surface. The coupling surface is thus in contact with the physical contact element of the temperature monitoring device and also surrounds the temperature sensor so that the temperature sensor is encased by the coupling surface. In this case, the receiving chamber can be bounded by a wall, wherein the temperature sensor preferably does not touch the wall. The temperature sensor is thus mechanically independent of the coupling surface and is not subjected to mechanical forces through the coupling surface during operation. A mechanical load on the temperature sensor due to the thermal coupling to the electrical functional element is thus prevented.

Heat is introduced into the temperature sensor from above via the coupling surface, in the notch of which the temperature sensor is accommodated. In addition, the temperature sensor is also heated from below, from the side of the support element, by heat being conducted to the temperature sensor from the at least one heat-conducting device embedded in the body of the support element. A cooling effect of the support element is thereby prevented. The temperature sensor can efficiently absorb heat from its environment and thus respond with a slight time delay to heating at the electrical functional element.

In one embodiment, the temperature sensor is designed as a surface-mounted component (a so-called SMD component) and is connected to the surface of the support element preferably via soldered connections. The temperature sensor is thus arranged directly on the surface of the support element and connected thereto, wherein feed lines can extend from the temperature sensor in order to emit sensor signals to a higher-level electrical assembly, in particular a control and evaluation device.

In one embodiment, the electrical functional element is connected to an insertion element. The support element has a receiving opening into which the insertion element is inserted so that the electrical functional element can be fastened to the support element via the insertion element. The insertion element can, for example, have a bushing shape with an opening into which the electrical functional element is inserted. However, the insertion element can, for example, also be formed integrally with the electrical functional element.

In one embodiment, the coupling surface via which the thermal coupling to the temperature monitoring device is established is formed on the insertion element. For this purpose, the insertion element can, for example, have a flange section which projects radially from the electrical functional element and is arranged radially outside a receiving opening of the support element into which the electrical functional element is inserted. The coupling surface is formed on the flange section so that the thermal coupling to the temperature monitoring device is established via the flange section.

If the insertion element takes the form of a separate element from the electrical functional element, the insertion element can be made of an electrically conductive metal material, for example the material of the electrical functional element. Alternatively, however, the insertion element can also be made of a non-electrically conductive but thermally conductive material, for example a thermally conductive plastic material or a ceramic material.

The flange section can in particular cover the temperature sensor of the temperature monitoring device. The coupling surface is formed on a side of the flange section facing the support element, wherein a notch in which the temperature sensor is accommodated is preferably formed on this coupling surface so that the temperature sensor is covered by the flange section but without necessarily touching the flange section.

The electrical assembly can, for example, be a component of a connector part that can be connected in a plug-in manner to an associated mating connector part. In this case, the electrical functional element can be realized, for example, by a contact element, in particular a load contact, of the connector part via which an electrical contact is established when the connector part is connected in a plug-in manner to the mating connector part, and via which load currents are conducted.

Several temperature monitoring devices may also be provided on such a connector part, wherein a separate temperature monitoring device can be provided, for example, on each contact element that serves to transmit load currents. The temperature monitoring devices can be arranged on a common support element, for example in the form of a circuit board, wherein each temperature monitoring device has a temperature sensor, a physical contact element, and at least one heat-conducting device embedded in the body of the support element.

The connector part can be used, for example, as a charging plug or as a charging socket of a charging system for charging an electric vehicle. For this purpose, the connector part has contact elements which serve as load contacts for transmitting a charging current, for example in the form of a direct current or in the form of an alternating current. A temperature monitoring device is preferably arranged on such load contacts, wherein each contact element in an advantageous embodiment is associated with its own temperature monitoring device. The temperature monitoring device is connected to a control device, for example, so that signals acquired via the temperature monitoring device can be evaluated and used for controlling a charging current transmitted via the load contacts.

A temperature sensor of the type described here can be formed, for example, by a temperature-dependent resistor, for example a resistor with a positive temperature coefficient (so-called PTC resistors), the resistance value of which increases with increasing temperature (also referred to as a PTC thermistor, which has good electrical conductivity at low temperatures and reduced electrical conductivity at higher temperatures). Such temperature sensors can, for example, also have a non-linear temperature characteristic and can, for example, be made of a ceramic material (so-called ceramic PTC thermistors).

However, an electrical resistor with a negative temperature coefficient (so-called NTC resistors) can, for example, also be used as a temperature sensor, the resistance value of which decreases with increasing temperature.

Alternatively or additionally, temperature sensors formed by semiconductor elements can also be used.

The idea behind the invention is explained in more detail below on the basis of the exemplary embodiments shown in the figures.

FIG. 1 shows in a schematic view a vehicle 1 in the form of a vehicle powered by an electric motor (also referred to as an electric vehicle). The electric vehicle 1 has electrically chargeable batteries via which an electric motor for moving the vehicle 1 can be electrically supplied.

In order to charge the batteries of the vehicle 1, the vehicle 1 can be connected to a charging station 2 via a charging cable 3. For this purpose, the charging cable 3 can be plugged with a charging plug 30 at one end into an associated mating connector part 4 in the form of a charging socket of vehicle 1 and is electrically connected at its other end via another charging plug 31 to a connector part 4 in the form of a charging socket on charging station 2. Charging currents of a comparatively high current intensity are transmitted to the vehicle 1 via the charging cable 3.

The connector part 4 on the side of the vehicle 1 and the connector part 4 on the side of the charging station 2 can differ. It is also possible to arrange the charging cable 3 undetachably at the charging station 2 (without plug connector part 4).

Figure 2:
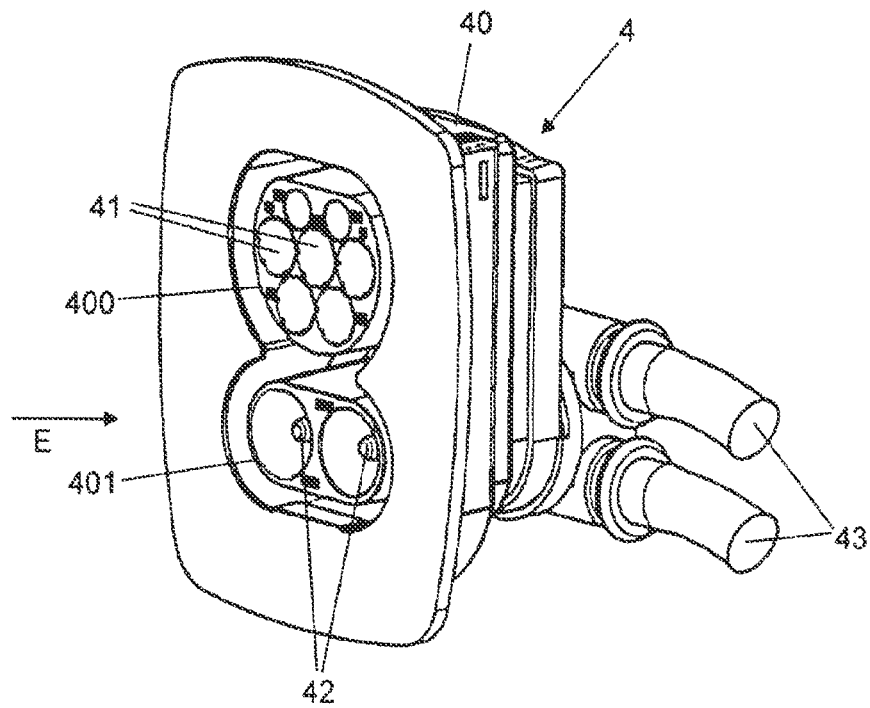
FIG. 2 shows a view of a connector part in the form of an inlet on the side of a vehicle.

FIG. 2 shows an exemplary embodiment of a connector part 4 in the form of a charging socket, for example, on the side of a vehicle (also referred to as a vehicle inlet), which can be connected, in a plug-in manner, to an associated mating connector part 30 in the form of a charging plug on a charging cable 3 so as to connect the electric vehicle 1 to the charging station 2 of the charging system. The connector part 4 comprises a housing part 40 on which plug-in sections 400, 401 are formed, to which the connector part 30 can be connected, in a plug-in manner, along a plug-in direction E. On the plug-in sections 400, 401, plug-in openings are formed in which contact elements 41, 42 are arranged via which an electrical connection to the associated mating connector part 30 can be established during plug-in connection.

In the exemplary embodiment shown, on a first, upper plug-in section 400, contact elements 41 are arranged via which, for example, a charging current in the form of an alternating current can be transmitted. In addition, contact elements may be present via which control signals can be transmitted.

In contrast, two contact elements 42, via which a charging current in the form of a direct current can be transmitted, are arranged on a second, lower plug-in section 401. The contact elements 42 are connected to load lines 43 via which the charging current is conducted.

When a charging current is being transmitted during operation, heating occurs at the contact elements 41, 42, wherein, in particular, in order to transmit a charging current in the form of a direct current, currents of a high current intensity, for example, up to 500 amps (A), can flow via the contact elements 42. In order to preclude excessive heating at the connector part 4 and, if necessary, to initiate measures in order to counteract excessive heating, a temperature increase at the contact elements 42 is to be monitored.

In order to monitor a temperature increase at the contact elements 42 of such a connector part 4 that serve as load contacts, the connector part 4 has an electrical assembly which is shown in an exemplary embodiment in FIGS. 3 to 13.

In such an electrical assembly, electrical functional elements in the form of contact elements 42 are arranged together on a support element 44 in the form of a circuit board and electrically connected to associated load lines 43.

Each contact element 42 is here accommodated in an associated receiving opening 440 of the support element 44 and is thus operatively connected to the support element 44.

Figure 3:
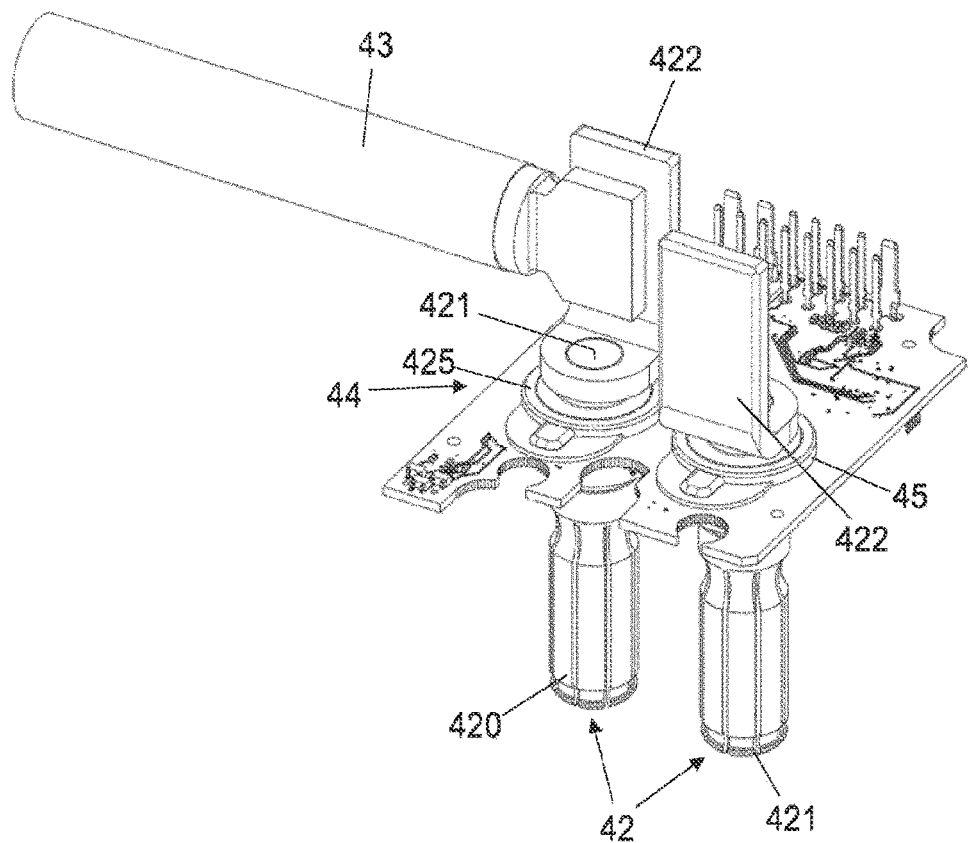
FIG. 3 shows a view of an exemplary embodiment of an electrical assembly comprising a support element and electrical functional elements in the form of contact elements arranged on the support element.
Figure 4:
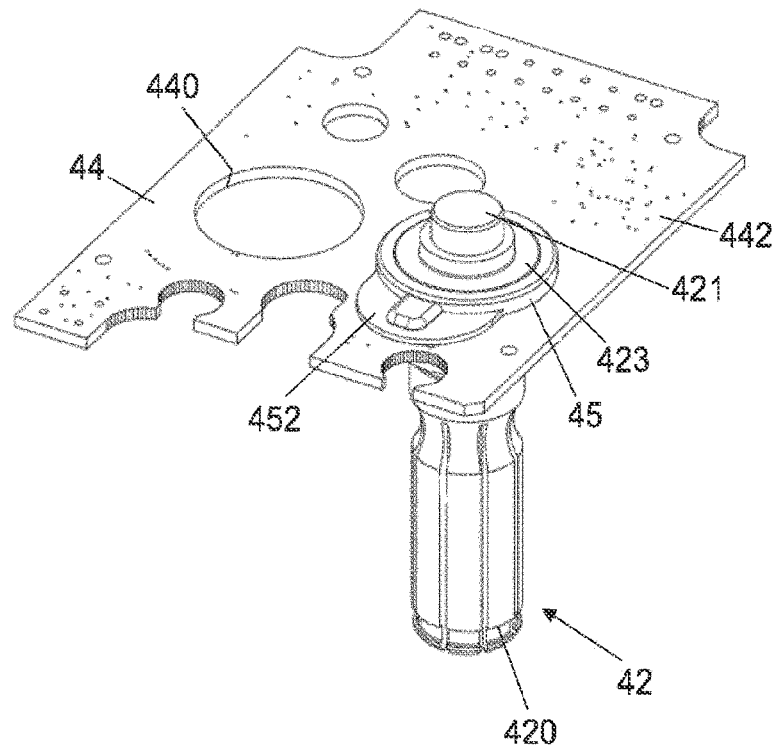
FIG. 4 shows a view of the electrical assembly with a single electrical functional element arranged on the support element.
Figure 5:
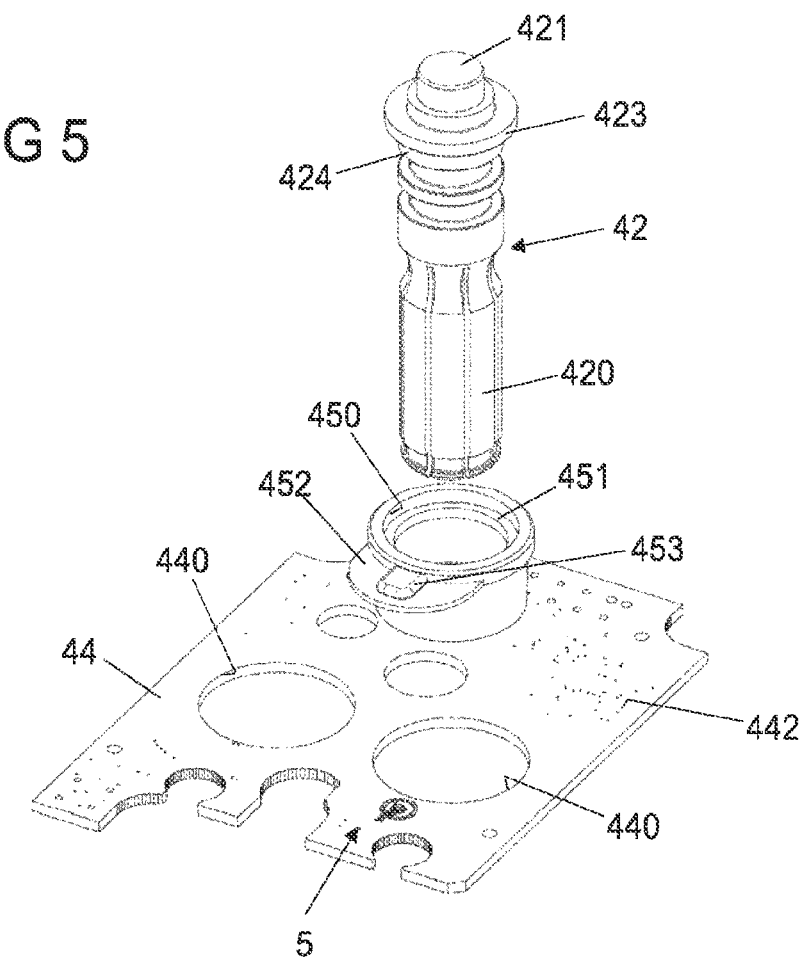
FIG. 5 shows an exploded view of the arrangement according to FIG. 4.

In the exemplary embodiment shown, each contact element 42 has a bushing section 420 for plug-in connection to a mating contact element in the form of a contact pin, rests with a shaft section 424 in an opening 450 of an insertion element 45 (see FIG. 5), and is arranged on the support element 44 via the insertion element 45. A collar 423 of the contact element 42 is in this case located on a ring collar 451 within the opening 450 of the associated insertion element 45 and with one end 421 pointing away from the bushing section 420 projects from the support element 44. The contact element 42 is connected via the end 421 to a connection section 422 and via it to an associated load line 43, as shown in FIG. 3.

Each contact element 42 is thus arranged (indirectly) on the support element 44 via an associated insertion element 45. The insertion element 45 can be made of an electrically conductive metal material, for example the same material as the contact element 42. Alternatively, however, the insertion element 45 can also be made of a non-electrically conductive but thermally conductive material, for example a thermally conductive plastic material or a ceramic material.

In the exemplary embodiment shown, the insertion element 45 has a flange section 452 projecting radially from the contact element 42 and covering a region of the support element 44 outside the associated receiving opening 440. A bulge 453 with a receiving chamber 454 located therein is formed on the flange section 452 and serves to accommodate a temperature monitoring device 5, which is arranged on a surface 442, facing the flange section 452, of the support element 44, in such a way that a temperature sensor 50 of the temperature monitoring device 5 is encased between the support element 44 and the flange section 452.

Figure 6:
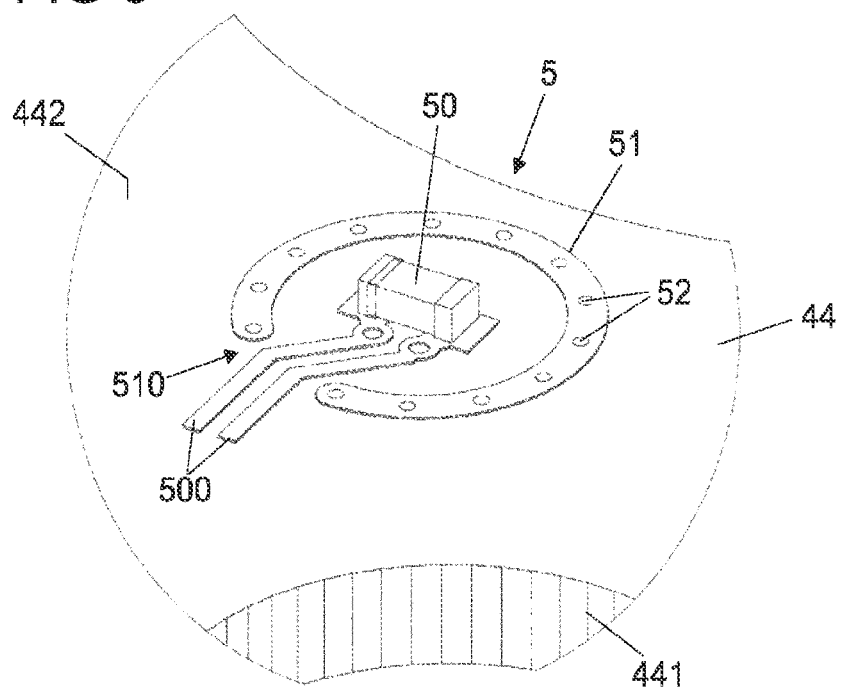
FIG. 6 shows an enlarged sectional view of the arrangement according to FIG. 5.
Figure 7:
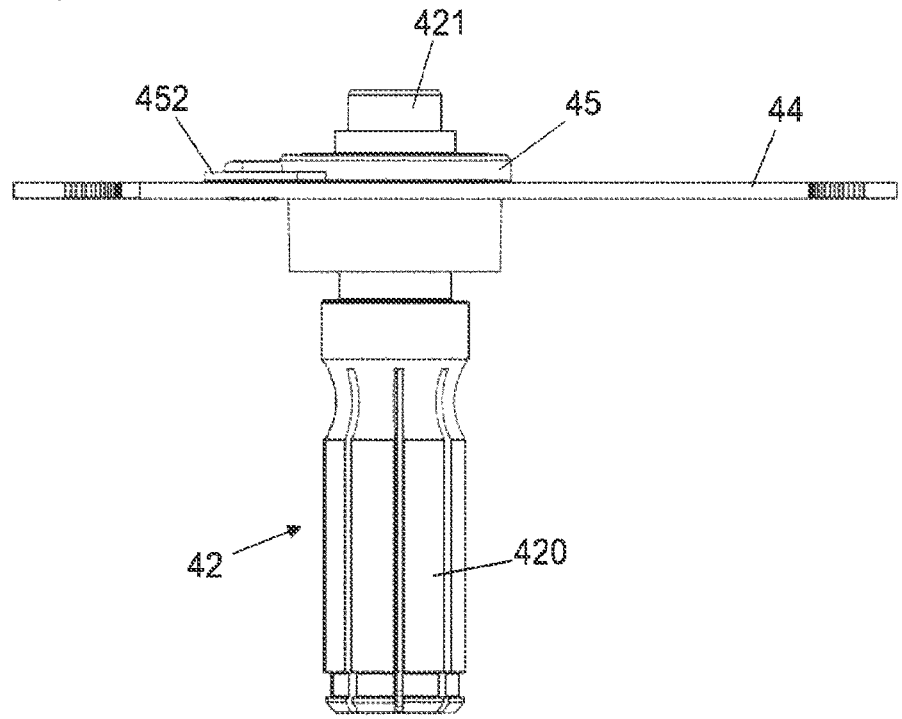
FIG. 7 shows a side view of the arrangement according to FIG. 4.

As shown in the enlarged view according to FIG. 6, the temperature monitoring device 5 has a temperature sensor 50 which is designed as a surface-mounted SMD component and is fixed to the surface 442 of the support element 44 via soldered connections. Extending circumferentially around the temperature sensor 44 is a physical contact element 51 which has the form of an open ring and forms a notch 510 through which feed lines 500 connected to the temperature sensor 50 extend.

Figure 8:
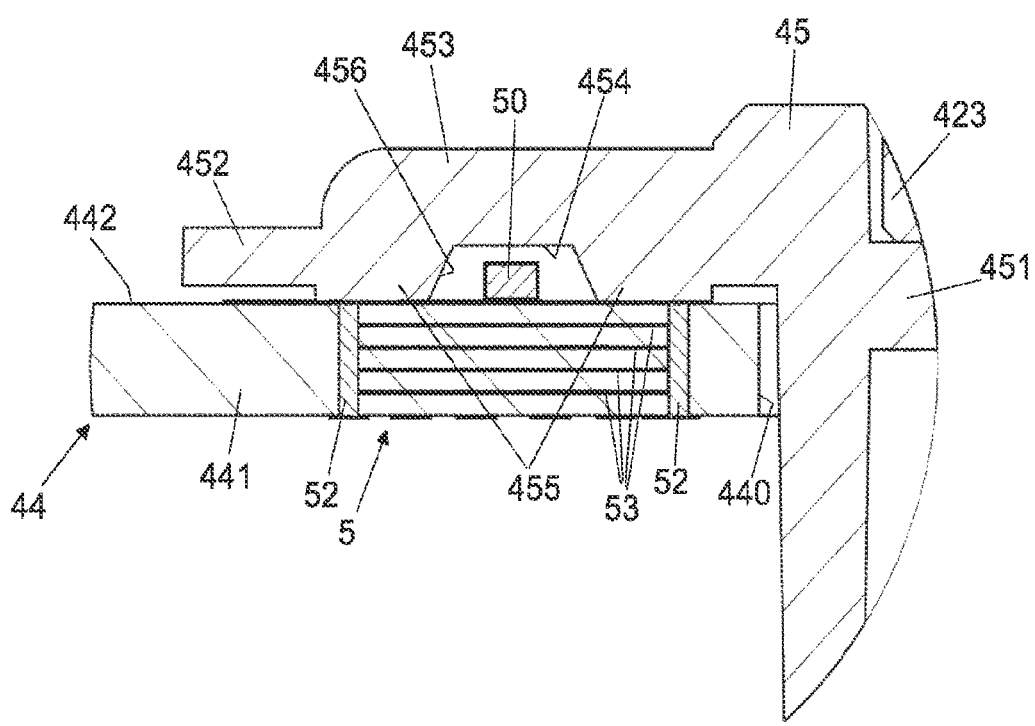
FIG. 8 shows an enlarged sectional view of the arrangement according to FIG. 7.

When the contact element 42 is mounted, the physical contact element 51 is in physical contact with a coupling surface 455 formed on the flange section 452, as is in particular evident from the enlarged sectional view according to FIG. 8. The insertion element 45 is thermally coupled to the temperature monitoring device 5 via the flange section 452 and the physical contact of the coupling surface 455 with the physical contact element 51 so that heat can be introduced from the contact element 42 via the insertion element 45 into the temperature monitoring device 5 and heating at the contact element 52 can thus be detected via the temperature monitoring device 5.

Figure 9:
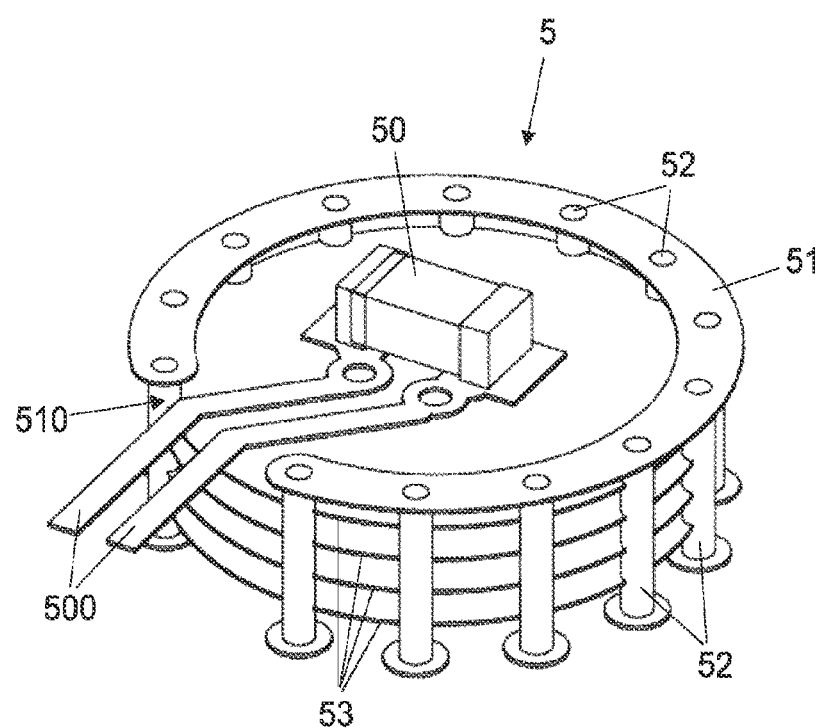
FIG. 9 shows a view of a temperature monitoring device of the electrical assembly without the support element.
Figure 10:
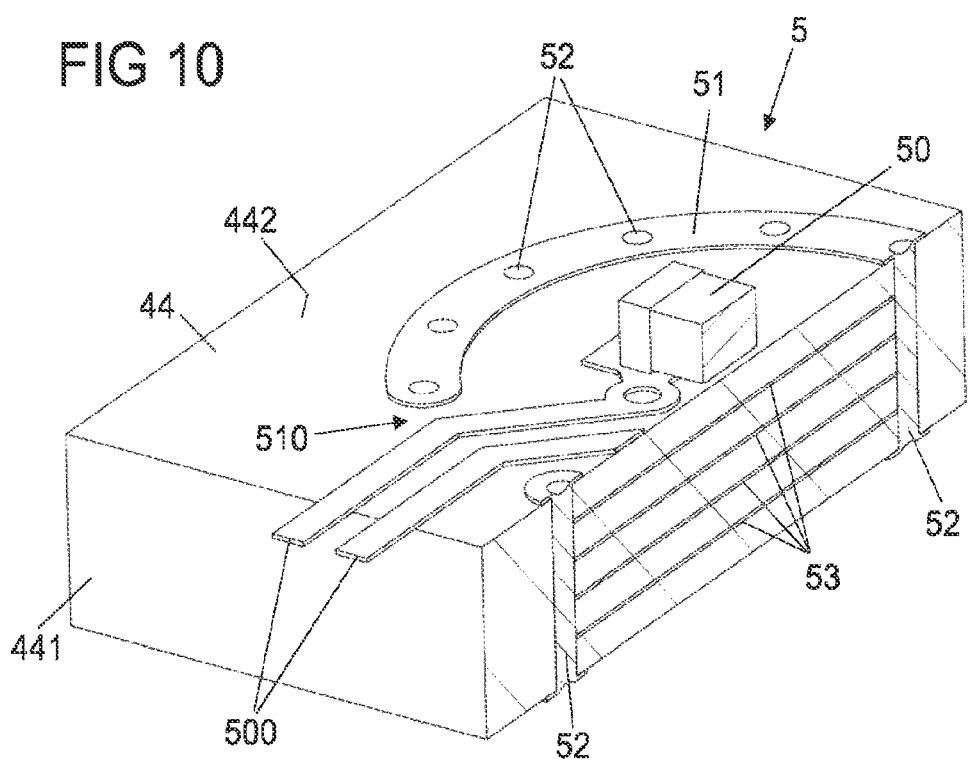
FIG. 10 shows a partial sectional view of the temperature monitoring device on the support element of the electrical assembly.
Figure 11:
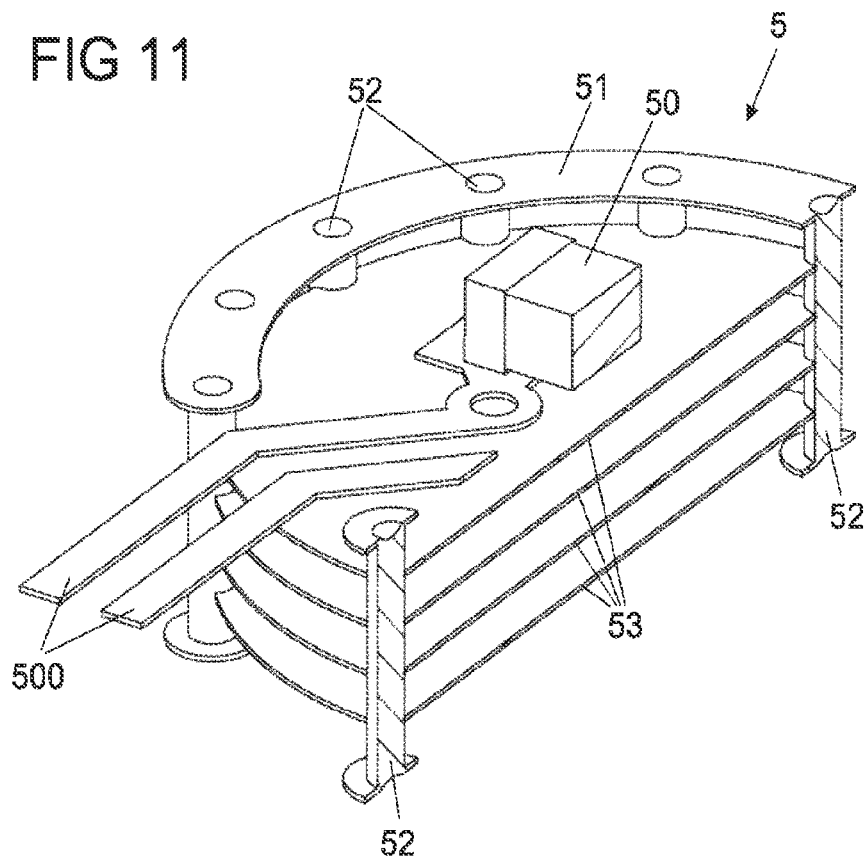
FIG. 11 shows the view according to FIG. 10 without the support element.
Figure 12:
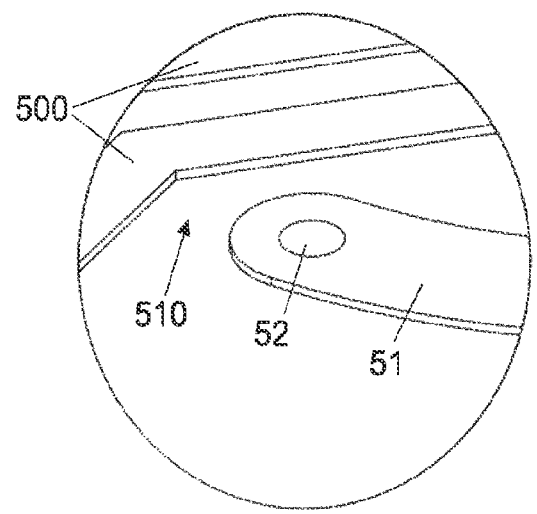
FIG. 12 shows an enlarged view of the temperature monitoring device in the region of a through-connection.

As shown in the sectional view according to FIG. 8 and also in the separate views of the temperature monitoring device 5 according to FIGS. 9 to 11, the temperature monitoring device 5 has heat-conducting devices 53 which are embedded in a body 441 of the support element 44 and respectively disk-shaped, in particular in the shape of a circular disk, and extend in parallel to one another along different planes in the body 441 of the support element 44. The heat-conducting devices 53 extend in this case in particular below the temperature sensor 50 in the support element 44 but are separated from the temperature sensor 50 by the (electrically non-conductive) material of the body 441 and are thus electrically insulated from the temperature sensor 50.

The heat-conducting devices 53 are connected to the physical contact element 51 via a plurality of through-connections 52, as shown, for example, in FIGS. 9 to 11. The through-connections 52 are arranged next to one another at equal distances on the physical contact element 51 along a circumferential direction extending around the temperature sensor 50.

The through-connections 52 extend from the physical contact element 51 substantially perpendicularly through the body 441 of the support element 44 and are connected to the heat-conducting devices 53, as shown, for example, in FIG. 9, so that heat can be introduced from the physical contact element 51 via the through-connections 52 into the heat-conducting devices 53 and thus distributed below the temperature sensor 50 in the support element 44.

Because the temperature sensor 50 is accommodated on the one hand in the receiving chamber 454 of the bulge 453 of the flange section 452 and is thus encased between the flange section 452 and the support element 44, and because on the other hand the temperature sensor 50 is also heated from below, that is, from the inside of the support element 44, via the heat-conducting devices 53 extending below the temperature sensor 50 in the support element 44, heat is efficiently introduced into the temperature sensor 50 so that the temperature sensor 50 can absorb heating at the associated contact element 52 without a major time delay. Due to the heating from below by the heat-conducting devices 53, it is in particular avoided that heat can flow away from the temperature sensor 50 into the support element 44 and that the support element 44 thus exerts a cooling effect on the temperature sensor 50, which could lead to a delay in the response behavior of the temperature sensor 50. Because the environment of the temperature sensor 50 is heated uniformly via the flange section 452 and the heat-conducting devices 53, and the temperature sensor 50 thus absorbs heat uniformly from its environment, the temperature sensor 50 can respond to heating at the contact element 42 with a rapid response time.

As shown in FIG. 8, the temperature sensor 50 is not in mechanical contact with the flange section 452. In particular, the temperature sensor 50 does not touch an internal wall 456 of the flange section 452 bounding the receiving chamber 454 so that mechanical stress on the temperature sensor 50 via the flange section 452 is prevented.

Figure 13:
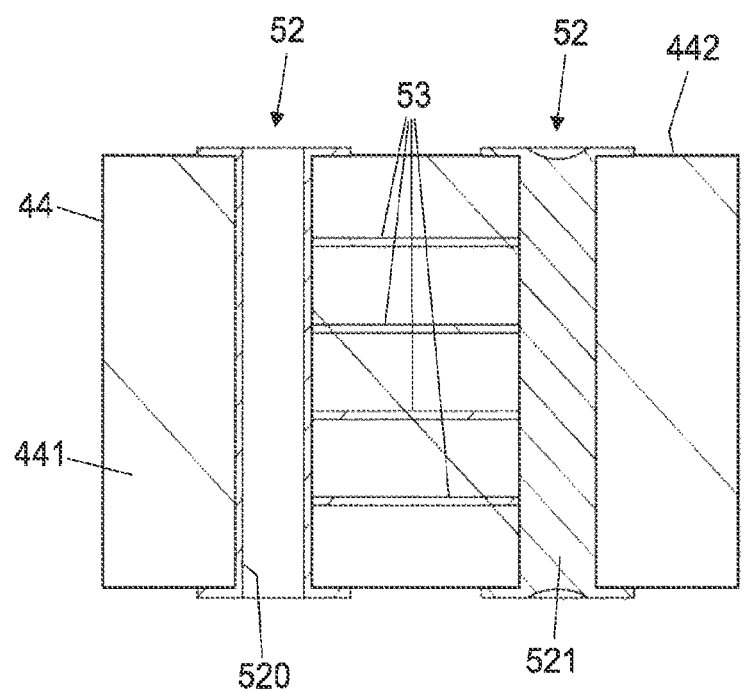
FIG. 13 shows a view of through-connections, before filling with a filling compound, and after filling with a filling compound.

In the exemplary embodiment shown, the through-connections 52 extend from the physical contact element 51 completely through the body 441 of the support element 44, as shown, for example, in FIG. 10. The through-connections 52 are formed by a hole that is metallized on the inside and forms an opening 520, as shown in FIG. 13 on the left. For improved thermal conduction, the opening 520 is filled with a filling compound 521 in the form of a soldering compound (solder), as shown in FIG. 13 on the right. Filling can take place, for example, using a reflow soldering process during production.

The flange section 452 does not contact the feed lines 500 of the temperature sensor 50 and thus in particular does not create a short circuit between the feed lines 500. In order to electrically insulate the flange section 452 from the feed lines 500, a recess in which the feed lines 500 are located can be formed on the flange section 452, for example. Additionally or alternatively, an electrically insulating element can be arranged between the flange section 452 and the feed lines 500.

When the assembly is mounted, the flange section 452 rests against the physical contact element 51 of the temperature monitoring device 5. In this case, the flange section 452 can rest directly against the physical contact element 51 via the coupling surface 455. If necessary, however, a material improving heat transfer (a so-called gap filler) can also be introduced into a joint gap between the coupling surface 455 and the physical contact element 51.

The idea underlying the invention is not limited to the exemplary embodiments described above but can in principle also be realized in a completely different manner.

A connector part of the type described here can advantageously be used in a charging system for charging an electric vehicle. The connector part can realize a charging socket (as in the illustrated exemplary embodiment) or a charging plug.

However, a different use is also conceivable. In principle, a connector part of the type described can be used wherever temperature monitoring on contact elements, for example, is desirable.

The physical contact element via which the contact element thermally couples to the temperature monitoring device can be designed as an open ring, as in the exemplary embodiment shown. However, it is also conceivable and possible for several physical contact elements to be provided for coupling, for example in the form of surface sections distributed around the temperature sensor. The physical contact element may also be angular, for example quadrangular.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Vehicle
2 Charging station
3 Charging cable
30, 31 Charging plug
4 Connector part
40 Housing part
400, 401 Plug-in section
41 Contact element
42 Functional element (contact element)
420 Socket section
421 End
422 Connection section
423 Collar
424 Shaft section
43 Load lines
44 Support element (circuit board)
440 Receiving opening
441 Body
442 Surface
45 Insertion element
450 Opening
451 Ring collar
452 Flange section
453 Bulge
454 Receiving chamber
455 Coupling surface
456 Wall
5 Temperature monitoring device
50 Temperature sensor
500 Feed lines
51 Physical contact element
510 Notch
52 Through-connections
520 Through-connection opening
521 Filling compound (solder)
53 Heat-conducting devices
E Plug-in direction

The invention claimed is:

1. An electrical assembly comprising a support element which has a body and a surface formed on the body, an electrical functional element arranged on the support element, and a temperature monitoring device arranged on the support element for monitoring a temperature on the electrical functional element, wherein the temperature monitoring device comprises a temperature sensor arranged on the surface of the support element, a physical contact element arranged on the surface of the support element, and at least one heat-conducting device embedded in the body of the support element, wherein the at least one heat-conducting device extends at least in sections below the temperature sensor in the body and is thermally connected to the physical contact element via at least one through-connection, and wherein the physical contact element is thermally coupled to a coupling surface operatively connected to the electrical functional element.

2. The electrical assembly according to claim 1, wherein the at least one through-connection extends from the surface through the body of the support element.

3. The electrical assembly according to claim 1, wherein the at least one through-connection is filled with a thermally conductive filling compound.

4. The electrical assembly according to claim 1, wherein the at least one heat-conducting device is thermally connected to the physical contact element via several through-connections which are arranged next to one another along a circumferential direction extending around the temperature sensor.

5. The electrical assembly according to claim 1, wherein the physical contact element extends at least in sections on the surface around the temperature sensor.

6. The electrical assembly according to claim 1, wherein the physical contact element has a notch on which the physical contact element, viewed along a circumferential direction extending around the temperature sensor, is interrupted, wherein at least one feed line connected to the temperature sensor extends through the notch at the surface of the support element.

7. The electrical assembly according to claim 1, wherein the temperature monitoring device has a plurality of heat-conducting devices embedded in the body of the support element and extending in parallel to one another.

8. The electrical assembly according to claim 1, wherein the temperature sensor as a surface-mounted device (SMD) component is connected to the surface of the support element.

9. A connector part for plug-in connection to an associated mating connector part, wherein the connector part comprises the electrical assembly according to claim 1 and the electrical functional element forms a contact element for electrically contacting the mating connector part.

10. The electrical assembly according to claim 1, wherein a receiving chamber in which the temperature sensor of the temperature monitoring device is accommodated is formed on the coupling surface.

11. The electrical assembly according to claim 10, wherein the temperature sensor does not touch a wall bounding the receiving chamber.

12. The electrical assembly according to claim 1, wherein the electrical functional element is connected to an insertion element and the support element has a receiving opening into which the insertion element is inserted.

13. The electrical assembly according to claim 12, wherein the coupling surface is formed on the insertion element.

14. The electrical assembly according to claim 12, wherein the insertion element has an opening into which the electrical functional element is inserted.

15. The electrical assembly according to claim 11, wherein the insertion element has a flange section on which the coupling surface is arranged.

\* \* \* \* \*